(12) United States Patent
Shimoaoki et al.

(10) Patent No.: US 10,359,702 B2
(45) Date of Patent: Jul. 23, 2019

(54) DEVELOPMENT PROCESSING APPARATUS, DEVELOPMENT PROCESSING METHOD, AND STORAGE MEDIUM

(71) Applicant: Tokyo Electron Limited, Tokyo (JP)

(72) Inventors: Takeshi Shimoaoki, Kumamoto (JP); Yusaku Hashimoto, Kumamoto (JP); Shogo Inaba, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 16/152,603

(22) Filed: Oct. 5, 2018

(65) Prior Publication Data

US 2019/0146344 A1  May 16, 2019

(30) Foreign Application Priority Data

Oct. 11, 2017 (JP) .................................. 2017-197728

(51) Int. Cl.
*G03F 7/16* (2006.01)

(52) U.S. Cl.
CPC .................................... *G03F 7/162* (2013.01)

(58) Field of Classification Search
CPC ......... G03F 7/32; G03F 7/162; G03F 7/70341
USPC .................................................... 355/27, 30
See application file for complete search history.

(56) References Cited

U.S. PATENT DOCUMENTS

2015/0352587 A1* 12/2015 Ichino ................... B05C 5/0216
                                                      427/286
2015/0362839 A1* 12/2015 Takeguchi ................ G03F 7/32
                                                      355/27

FOREIGN PATENT DOCUMENTS

JP          2016-058712 A      4/2016

* cited by examiner

*Primary Examiner* — Hung Nguyen
(74) *Attorney, Agent, or Firm* — Abelman Frayne & Schwab

(57) ABSTRACT

Provided is a development processing apparatus including a rotary holding unit configured to hold and rotate a wafer, a developer supply unit including a nozzle having a liquid contact surface facing a surface of the wafer and an ejection port opening to the liquid contact surface, and a controller. The controller is configured to: while the wafer rotates, execute a control of causing a developer to be ejected from the ejection port and moving the nozzle from an circumference side to a rotation center side of the wafer; after execution of the control, execute a control of moving the nozzle from the rotation center side to the outer circumference side of the wafer; and during execution of the control, execute a control of gradually reducing the rotation speed of the wafer as the center of the liquid contact surface approaches the outer circumference.

10 Claims, 15 Drawing Sheets

DEVELOPMENT PROCESSING APPARATUS, DEVELOPMENT PROCESSING METHOD, AND STORAGE MEDIUM

CROSS-REFERENCE TO RELATED APPLICATIONS

This application is based on and claims priority from Japanese Patent Application No. 2017-197728, filed on Oct. 11, 2017 with the Japan Patent Office, the disclosure of which is incorporated herein in its entirety by reference.

TECHNICAL FIELD

The present disclosure relates to a development processing apparatus, a development processing method, and a storage medium.

BACKGROUND

Japanese Patent Laid-Open Publication No. 2016-058712 discloses a development method including forming a liquid reservoir on a portion of the surface of a substrate using a developer nozzle including a contact portion facing the surface of the substrate, and moving the developer nozzle in the central portion and from one side to the other side of the circumferential portion of the substrate which is rotating while supplying the developer in the state in which the contact portion is in contact with the liquid reservoir.

SUMMARY

A development processing apparatus according to an aspect of the present disclosure includes a rotary holding unit configured to hold and rotate a wafer, a first supply unit including a nozzle having a liquid contact surface facing a surface of the wafer held on the rotary holding unit and an ejection port opening to the liquid contact surface, and a controller. The controller is configured to: execute a scan-in control of controlling the first supply unit such that while the rotary holding unit is rotating the wafer, the first supply unit causes the developer to be ejected from the ejection port and move the nozzle from an outer circumference side of the wafer to a rotation center side of the wafer while bringing the liquid contact surface into contact with the developer on the surface of the wafer; execute, after executing the scan-in control, a scan-out control of controlling the first supply unit such that while the rotary holding unit is rotating the wafer, the first supply unit causes the developer to be ejected from the ejection port and moves the nozzle from the rotation center side to the outer circumference side of the wafer while bringing the liquid contact surface into contact with the developer on the surface of the wafer; and execute, during the execution of the scan-out control, a deceleration control of controlling the rotary holding unit such that the rotary holding unit gradually reduces a rotation speed of the wafer as a center of the liquid contact surface approaches the outer circumference of the wafer.

There is a concern that such a ball screw, a guide rail, or a pipe restricting member may generate dust when the moving mechanism moves. Thus, the dust generated from the moving mechanism may be scattered above a cup body and adhere to the wafer held in the substrate holding unit.

DESCRIPTION OF EMBODIMENT

Figure 1:
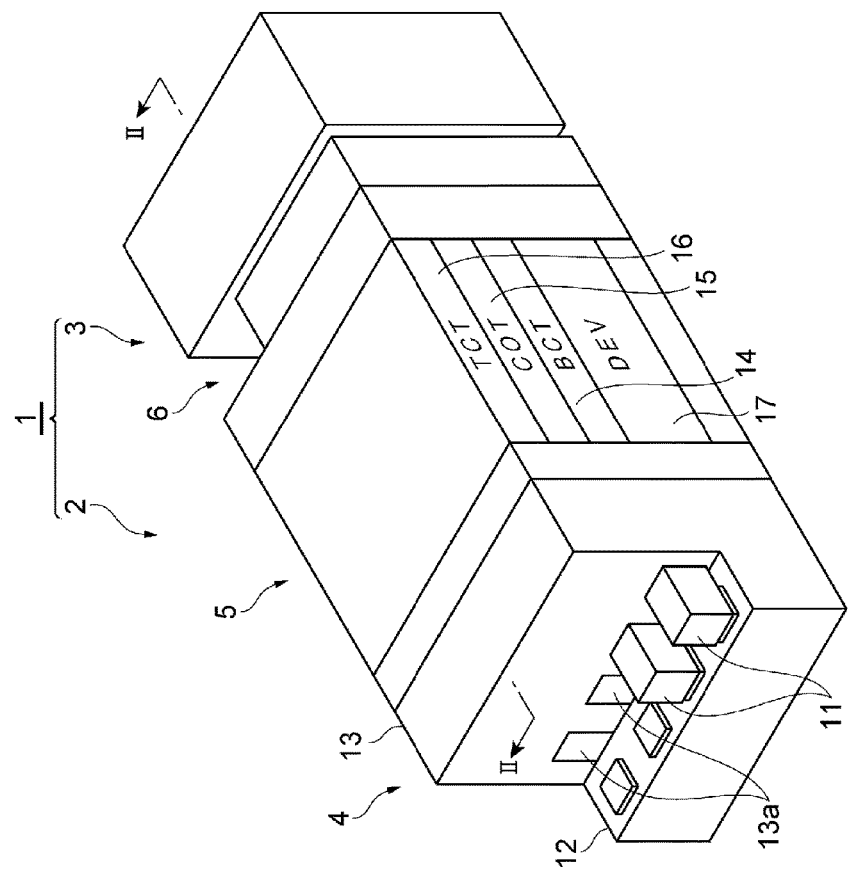
FIG. 1 is a perspective view illustrating a schematic configuration of a substrate processing system.

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

The present disclosure aims to provide a development processing apparatus and a development processing method which are effective for suppressing the degree of progress of a development processing depending on a position on a substrate.

A development processing apparatus according to an aspect of the present disclosure includes a rotary holding unit configured to hold and rotate a wafer, a first supply unit including a nozzle having a liquid contact surface facing a surface of the wafer held on the rotary holding unit and an ejection port opening to the liquid contact surface, and a controller. The controller is configured to: execute a scan-in control of controlling the first supply unit such that while the rotary holding unit is rotating the wafer, the first supply unit causes the developer to be ejected from the ejection port and move the nozzle from an outer circumference side of the wafer to a rotation center side of the wafer while bringing the liquid contact surface into contact with the developer on the surface of the wafer; execute, after executing the scan-in control, a scan-out control of controlling the first supply unit such that while the rotary holding unit is rotating the wafer, the first supply unit causes the developer to be ejected from the ejection port and moves the nozzle from the rotation center side to the outer circumference side of the wafer while bringing the liquid contact surface into contact with the developer on the surface of the wafer; and execute, during the execution of the scan-out control, a deceleration control of controlling the rotary holding unit such that the rotary holding unit gradually reduces a rotation speed of the wafer as a center of the liquid contact surface approaches the outer circumference of the wafer.

According to the development processing apparatus, the developer is applied twice to the surface of the wafer by executing the scan-in control and the scan-out control. Since the contact angle of the developer with respect to the surface of the wafer is reduced by the first application, the developer is smoothly applied and spread in the second application.

In the first application, since the nozzle moves from the outer circumference side to the rotation center side of the substrate, the developer is applied first from the outer circumference side of the substrate. On the other hand, in the second application, since the nozzle moves from the rotation center side to the outer circumference side of the substrate, the developer is applied first from the rotation center side of the substrate. Therefore, a difference in the degree of progress of the development processing, which may be caused due to a difference in the application timing of the developer, hardly occurs due to the combination of the first application and the second application. Furthermore, in the second application, as the nozzle moves from the rotation center side to the outer peripheral side of the substrate, a new developer is applied and spread while pushing the old developer outward.

During the execution of the scan-out control, the deceleration control is executed to gradually reduce the rotational speed of the substrate as the center of the liquid contact surface approaches the outer circumference of the substrate. Due to the reduction in the rotational speed, excessive sputtering of the developer is suppressed, and an appropriate liquid film is formed on the surface of the substrate. Furthermore, since the rotation speed of the substrate is gradually reduced, the pullback (a phenomenon in which the developer spreading to the outer circumference side returns to the rotation center side) caused by sudden deceleration is suppressed, and the developer can be spread more smoothly.

From the above, it is possible to form a highly uniform liquid film of a developer. Therefore, the development processing apparatus is effective for suppressing the degree of progress of the development processing from varying depending on a position on the wafer.

In the deceleration control, the controller may control the rotary holding unit to gradually reduce the deceleration of the rotation of the wafer as the center of the liquid contact surface approaches the outer circumference of the wafer. In this case, it is possible to apply and spread the developer more smoothly by appropriately adjusting a centrifugal force acting on the developer ejected from the nozzle.

In the deceleration control, the controller may control the rotary holding unit such that an arbitrary point in the liquid contact surface moves at a constant speed with respect to the surface of the substrate. In this case, it is possible to apply and spread the developer more smoothly by appropriately adjusting a centrifugal force acting on the developer ejected from the nozzle.

In the scan-out control, the controller may control the rotary holding unit to reduce a change in the rotation of the substrate during a period from an end of the scan-in control to a start of the deceleration control in comparison with a change amount of the rotation speed of the substrate in the deceleration control. In this case, by setting the rotation speed of the substrate at the start of the deceleration control to a level close to the rotation speed of the substrate at the end of the scan-in control, it is possible to apply and spread the developer more smoothly.

In the deceleration control, the controller may control the rotary holding unit to continue the deceleration of the rotation speed of the substrate for a long time in comparison with an execution time of the scan-in control. In this case, by decelerating the rotation speed of the substrate more gently, it is possible to apply and spread the developer more smoothly.

In the scan-out control, the controller may control the first liquid supply unit to eject the developer from the ejection port while a center of the liquid contact surface is on a way of moving toward the outer circumference side away from the rotation center of the substrate. In this case, it is possible to suppress the progress of the development processing at the rotation center of the substrate.

In the scan-out control, the controller may control the first liquid supply unit to stop the ejection of the developer from the ejection port before the center of the liquid contact surface reaches the rotation center of the substrate. In this case, it is possible to more securely suppress the progress of the development processing at the rotation center of the substrate.

The development processing apparatus may further include a second supply unit configured to supply a pre-wet liquid different from the developer to the surface of the substrate held on the rotary holding unit, and The controller may be configured to additionally execute pre-wet control of controlling the second supply unit to supply the pre-wet liquid to the surface of the substrate before the execution of the scan-in control and while the rotary holding unit rotates the substrate. In this case, in the scan-in control, it is possible to apply and spread the developer more smoothly.

A development processing method according to another aspect of the present disclosure includes: holding and rotating a wafer; causing a developer to be ejected from an ejection port of a nozzle having a liquid contact surface and the ejection port which opens to the liquid contact surface, and moving the nozzle from an outer circumference side to a rotation center side of the nozzle while bringing the liquid contact surface into contact with the developer on the surface of the rotating substrate; after moving the nozzle to from the outer circumference side to the rotation center side of the substrate, causing the developer to be ejected from the ejection port and moving the nozzle from the rotation center side to the outer circumference side of the substrate while bringing the nozzle into contact with the developer on the surface of the rotating substrate; and reducing a rotation speed of the substrate as a center of the liquid contact surface approaches the outer circumference of the substrate while the nozzle moves from the rotation center side to the outer circumference side of the substrate while ejecting the developer from the ejection port.

A storage medium according to still another aspect of the present disclosure is a computer-readable storage medium that stores a program causing an apparatus to execute the development processing method.

According to the present disclosure, it is possible to provide a development processing apparatus and a development processing method which are effective for suppressing the degree of progress of a development processing depending on a position on a substrate.

Hereinafter, an exemplary embodiment will be described in detail with reference to the drawings. In the description, the same elements or elements having the same function will be denoted by the same symbols, and a redundant description will be omitted.

[Substrate Processing System]

A substrate processing system 1 is a system for forming a photosensitive film, exposing the photosensitive film, and developing the photosensitive film on a substrate. A processing target substrate is, for example, a semiconductor wafer W. The photosensitive film is, for example, a resist film. The substrate processing system 1 includes a coating/development apparatus 2 and an exposure apparatus 3. The exposure apparatus 3 performs an exposure processing of the resist film (photosensitive film) formed on the wafer W (substrate). Specifically, an exposure target portion of the resist film is irradiated with an energy beam by a method such as, for example, liquid immersion exposure. The coating/development apparatus 2 performs a resist film formation processing on the surface of the wafer W (substrate) before the exposure processing performed by the exposure apparatus 3, and performs a resist film development processing after the exposure processing.

[Substrate Processing Apparatus]

Figure 2:
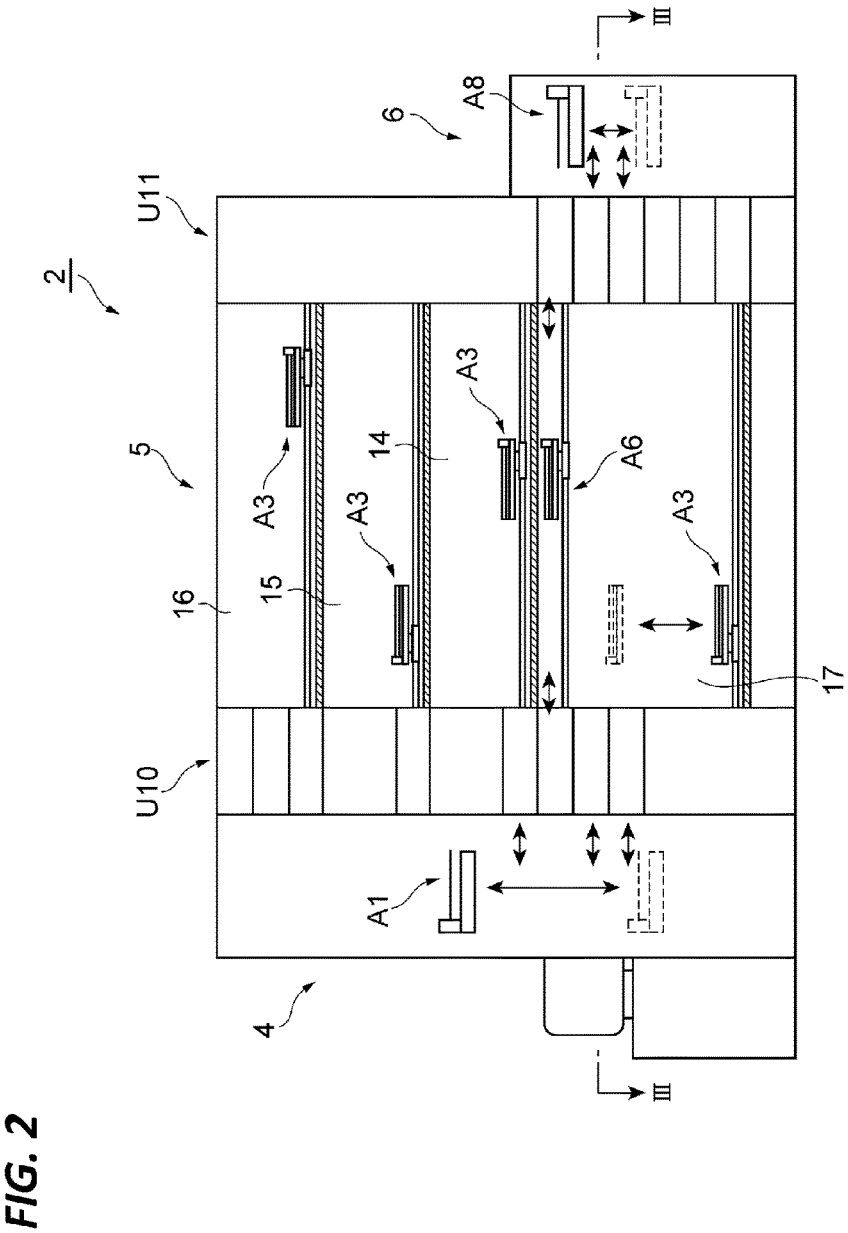
FIG. 2 is a cross-sectional view taken along line II-II in FIG. 1.
Figure 3:
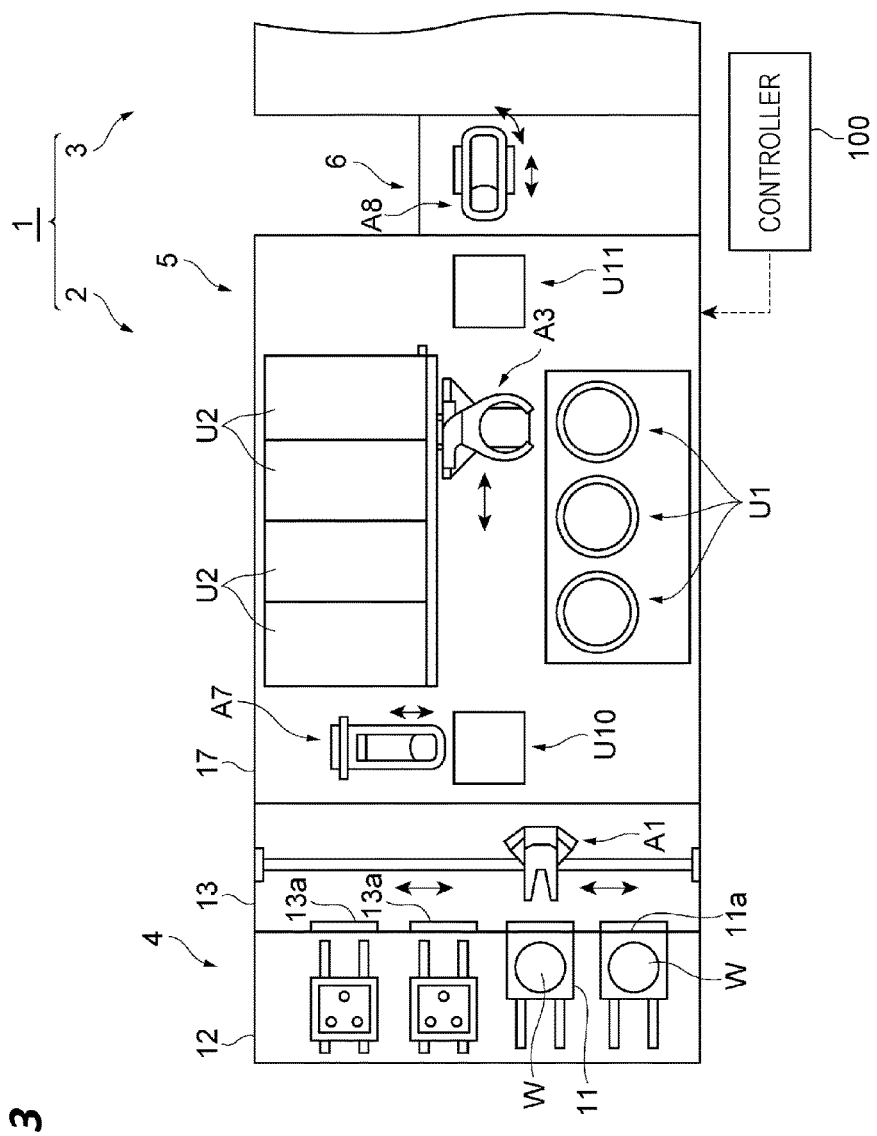
FIG. 3 is a cross-sectional view taken along line III-III in FIG. 2.

Hereinafter, the configuration of a coating/development apparatus 2 will be described as an example of a substrate processing apparatus. As illustrated in FIGS. 1 to 3, the coating/development apparatus 2 includes a carrier block 4, a processing block 5, an interface block 6, and a controller 100.

The carrier block 4 performs loading of the wafer W into the coating/development apparatus 2 and unloading of the wafer W from the inside of the coating/development apparatus 2. For example, the carrier block 4 is capable of supporting a plurality of wafer W carriers 11, and has a delivery arm A1 therein. A carrier 11 accommodates, for example, a plurality of circular wafers W. The delivery arm A1 takes out a wafer W from the carrier 11 and delivers the wafer to the processing block 5, and the delivery arm A1 receives a wafer W from the processing block 5 and returns the wafer W to the inside of the carrier 11.

The processing block 5 includes a plurality of processing modules 14, 15, 16, 17. As illustrated in FIGS. 2 and 3, the processing modules 14, 15, 16, 17 include therein a plurality of liquid processing units U1, a plurality of heat treatment units U2, and a transport arm A3 for transporting wafers W to these units. The processing module 17 further includes a direct transport arm A6 configured to transport a wafer W without passing through the liquid processing units U1 and the heat treatment units U2. Each liquid processing unit U1 supplies a processing liquid to the surface of a wafer W. Each thermal processing unit U2 incorporates, for example, a hot plate and a cooling plate, and performs a heat treatment by heating a wafer W by the hot plate and cooling the heated wafer W by the cooling plate.

The processing module 14 forms an underlayer film on the surface of the wafer W by the liquid processing units U1 and the heat treatment units U2. The liquid processing units U1 of the processing module 14 apply a processing liquid for forming the underlayer film on the wafer W. The heat treatment units U2 of the processing module 14 perform various heat treatments according to the formation of the underlayer film.

The processing module 15 forms a resist film on the underlayer film by the liquid processing units U1 and the heat treatment units U2. The liquid processing units U1 of the processing module 15 apply a processing liquid for forming the resist film on the underlayer film. The heat treatment units U2 of the processing module 15 perform various heat treatments according to the formation of the resist film.

The processing module 16 forms an upper layer film on the resist film by the liquid processing units U1 and the heat treatment units U2. The liquid processing units U1 of the processing module 16 apply a processing liquid for forming the upper layer film on the resist film. The heat treatment units U2 of the processing module 16 perform various heat treatments according to the formation of the upper layer film.

The processing module 17 carries out a development processing of the resist film after exposure by the liquid processing units U1 and the heat treatment units U2. The liquid processing units U 1 of the processing module 17 apply a developer to the surface of the exposed wafer W and then rinses the developer with a rinsing liquid to develop the resist film. The heat treatment units U2 of the processing module 17 perform various heat treatments according to the development processing. Specific examples of heat treatments include, for example, a heat treatment before the development processing (post exposure bake (PEB) and a heat treatment after the development treatment (post bake (PB).

A shelf unit U10 is provided on the carrier block 4 side in the processing block 5. The shelf unit U10 is partitioned into a plurality of cells aligned in the vertical direction. A lift arm A7 is provided in the vicinity of the shelf unit U10. The lift arm A7 moves a wafer W up and down between the cells of the shelf unit U 10.

A shelf unit U11 is provided on the interface block 6 side in the processing block 5. The shelf unit U11 is partitioned into a plurality of cells aligned in the vertical direction.

The interface block 6 delivers the wafer W to/from the exposure apparatus 3. For example, the interface block 6 incorporates a deliver arm A 8, and is connected to the exposure apparatus 3. The deliver arm A8 delivers a wafer W placed on the shelf unit U11 to the exposure apparatus 3, receives a wafer W from the exposure apparatus 3, and returns the to the shelf unit U11.

The controller 100 controls the coating/development apparatus 2 to execute a coating/development processing in the following procedure, for example. First, the controller 100 controls the deliver arm A1 to deliver a wafer W in the carrier 11 to the shelf unit U10, and controls the lift arm A7 to place the wafer W in the cell for the processing module 14.

Next, the controller 100 controls the deliver arm A3 to deliver the wafer W in the shelf unit U10 to the liquid processing units U1 and the heat treatment units U2 in the processing module 14, and controls the liquid processing units U1 and the heat treatment units U2 to form an underlayer film on the surface of the wafer W. Thereafter, the controller 100 controls the deliver arm A3 to return the wafer W on which the underlayer film is formed to the shelf unit U10, and controls the lift arm A7 to place the wafer W in a cell for the processing module 15.

Next, the controller 100 controls the deliver arm A3 to deliver the wafer W in the shelf unit U10 to the liquid processing units U1 and the heat treatment units U2 in the processing module 15, and controls the liquid processing units U1 and the heat treatment units U2 to form a resist film on the underlayer film of the wafer W. Thereafter, the controller 100 controls the deliver arm A3 to return the wafer W to the shelf unit U10, and controls the lift arm A7 to place the wafer W in a cell for the processing module 16.

Next, the controller 100 controls the deliver arm A3 to deliver the wafer W in the shelf unit U10 to each unit within the processing module 16, and controls the liquid processing units U1 and the heat treatment units U2 to form an upper layer film on the resist film of the wafer W. Thereafter, the controller 100 controls the deliver arm A3 to return the wafer W to the shelf unit U10, and controls the lift arm A7 to place the wafer W in a cell for the processing module 17.

Next, the controller 100 controls the direct transport arm A6 to transport the wafer W of the shelf unit U10 to the shelf unit U11, and controls the deliver arm A8 to send the wafer W to the exposure apparatus 3. Thereafter, the controller 100 controls the deliver arm A8 to receive the wafer W subjected to the exposure processing from the exposure apparatus 3 and return the wafer W to the shelf unit U11.

Next, the controller 100 controls the deliver arm A3 to deliver the wafer W in the shelf unit U11 to each unit within the processing module 17, and controls the liquid processing units U1 and the heat treatment units U2 to perform a development processing on the resist film of the wafer W. Thereafter, the controller 100 controls the deliver arm A3 to return the wafer W to the shelf unit U10, and controls the lift arm A7 and the deliver arm A1 to return the wafer W into the processing module 11. Then, the coating/development processing is completed.

The specific configuration of the substrate processing apparatus is not limited to the configuration of the coating/development apparatus 2 exemplified above. The substrate processing apparatus may be of any type as long as it includes a liquid processing unit U1 for a development processing (the liquid processing units U1 of processing module 17) and a controller 100 capable of controlling the processing unit U1.

[Development Processing Apparatus]

Figure 4:
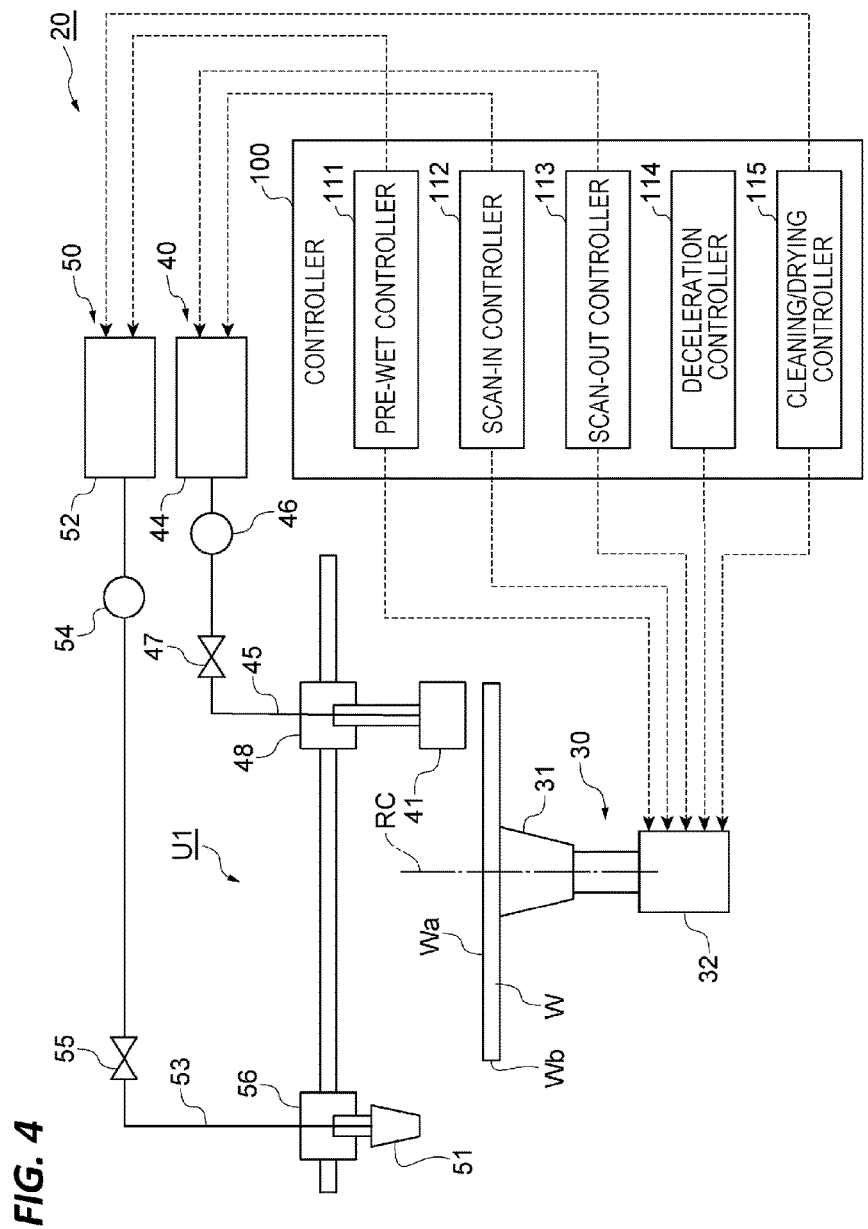
FIG. 4 is a schematic view illustrating a schematic configuration of a development processing apparatus.

Next, a development processing apparatus 20 included in the coating/development apparatus 2 will be described. As illustrated in FIG. 4, the development processing apparatus 20 includes the liquid processing unit U1 and the controller 100 of the above-described processing module 17. The liquid processing unit U1 includes a rotary holding unit 30, a developer supply unit 40 (a first supply unit), and a rinsing liquid supply unit 50 (a second supply unit).

The rotary holding unit 30 holds and rotates a wafer W. For example, the rotary holding unit 30 includes a holding mechanism 31 and a rotary mechanism 32. The holding mechanism 31 supports the central portion of a horizontally disposed wafer W, and holds the wafer W by vacuum suction or the like, for example. The rotary mechanism 32 incorporates, for example, an electric motor or the like as a power source, and rotates the holding mechanism 31 around a vertical rotation center RC. As a result, the wafer W rotates around the rotation center RC.

The developer supply unit 40 supplies a developer to a surface Wa of the wafer W held by the holding mechanism 31. The developer is a processing solution for removing a removal target portion in the resist film after exposure. The removal target portion in the resist film is a portion soluble to the developer after the exposure processing. When the developer is of a positive type, a portion exposed in the exposure processing is soluble to the developer. When the developer is of a negative type, a portion non-exposed in the exposure processing is soluble to the developer. A specific example of the positive-type developer includes an alkaline solution. A specific example of the negative-type developer includes an organic solvent. The developer supply unit 40 includes, for example, a nozzle 41, a tank 44, a pump 46, a valve 47, and a nozzle transport mechanism 48.

Figure 5:
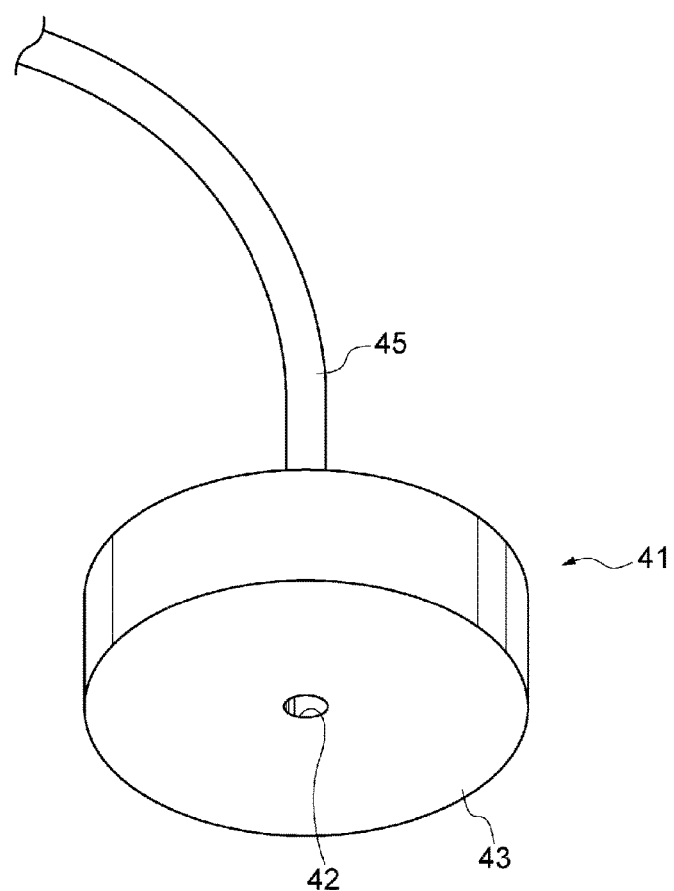
FIG. 5 is a perspective view illustrating an example of a nozzle.

The nozzle 41 ejects the developer toward the surface Wa of the wafer W. As illustrated in FIG. 5, the nozzle 41 includes a liquid contact surface 43 facing the surface Wa of the wafer W held by the holding mechanism 31, and an ejection port 42 opening to the liquid contact surface 43. For example, the nozzle 41 has a circular liquid contact surface 43, and the ejection port 42 opens to the central portion of the liquid contact surface 43. The area of the liquid contact surface 43 is smaller than the area of the surface Wa of the wafer W. The area of the liquid contact surface 43 is, for example, 1 to 11% of the area of the surface Wa of the wafer W, and may be 1 to 3% of the area of the surface Wa of the wafer W. The nozzle 41 may be made of a resin material such as, for example, PTFE. The nozzle 41 may include a plurality of ejection ports 42 dotted on the liquid contact surface 43.

Returning to FIG. 4, the nozzle 41 is connected to a tank 44 via a pipe line 45. The tank 44 contains a developer. A pump 46 and a valve 47 are provided in the pipe line 45. The pump 46 is, for example, a bellows pump, and forcibly feeds the developer from the tank 44 to the nozzle 41. The valve 47 is, for example, an air operation valve and adjusts the degree of opening in the pipe line 45. By controlling the valve 47, it is possible to perform switching between a state where the developer is ejected from the nozzle 41 and a state where the developer is not ejected from the nozzle 41. Further, by controlling at least one of the pump 46 and the valve 47, it is also possible to adjust the ejection amount (the ejection amount per unit time) of the developer from the nozzle 41.

The nozzle transport mechanism 48 adjusts the position of the nozzle 41. More specifically, the nozzle transport mechanism 48 transports the nozzle 41 to traverse the upper side of the wafer W with the liquid contact surface 43 facing downward, and moves the nozzle 41 up and down. For example, the nozzle transport mechanism 48 has a mechanism configured to transport the nozzle 41 so as to traverse the upper side of the wafer W using, for example, an electric motor as a power source, and a mechanism configured to move up and down the nozzle 41 using, for example, an electric motor as a power source.

The nozzle transport mechanism 48 may transport the nozzle 41 along a path passing through the rotation center RC of the wafer W or may transport the nozzle 41 along a path deviated from the rotation center RC. The nozzle transport mechanism 48 may transport the nozzle 41 along a straight path or may transport the nozzle 41 along a curved path.

The rinsing liquid supply unit 50 supplies a rinsing liquid different from the developer to the surface Wa of the wafer W held by the holding mechanism 31. The rinsing liquid is used for rinsing the developer. The rinsing liquid is also used as a pre-wet liquid applied to the surface Wa before supplying the developer. The rinsing liquid is, for example, pure water. The rinsing liquid supply unit 50 includes, for example, a nozzle 51, a tank 52, a pump 54, a valve 55, and a nozzle transport mechanism 56 (a position adjustment unit).

The nozzle 51 ejects the rinsing liquid toward the surface Wa of the wafer W. The nozzle 51 is connected to the tank 52 via a pipe line 53. The tank 52 accommodates the rinsing liquid. A pump 54 and a valve 55 are provided in the pipe line 53. The pump 54 is, for example, a bellows pump, and forcibly feeds the rinsing liquid from the tank 52 to the nozzle 51. The valve 55 is, for example, an air operation valve and adjusts the degree of opening in the pipe line 53. By controlling the valve 55, it is possible to perform switching between a state where the rinsing liquid is ejected from the nozzle 51 and a state where the rinsing liquid is not ejected from the nozzle 51. Further, by controlling at least one of the pump 54 and the valve 55, it is also possible to adjust the ejection amount of the rinsing liquid from the nozzle 51.

The nozzle transport mechanism 56 transports the nozzle 51 using, for example, an electric motor or the like as a power source. Specifically, the nozzle transport mechanism 56 transports the nozzles 51 to traverse the upper side of the wafer W with the ejection port of the nozzle 51 facing downward.

The controller is configured to: execute a scan-in control of controlling the developer supply unit 40 such that while the rotary holding unit 30 is rotating the wafer W, the developer supply unit 40 causes the developer to be ejected from the ejection port 42 and moves the nozzle 41 from an outer circumference Wb side of the wafer W to a rotation center RC side of the wafer while bringing the liquid contact surface 43 into contact with the developer on the surface Wa of the wafer W; execute, after executing the scan-in control, a scan-out control of controlling the developer supply unit 40 such that while the rotary holding unit 30 is rotating the wafer W, the developer supply unit 40 causes the developer to be ejected from the ejection port 42 and moves the nozzle 41 from the rotation center RC side to the outer circumference Wb side while bringing the liquid contact surface 43 into contact with the developer on the surface Wa; and execute, during the execution of the scan-out control, a deceleration control of controlling the rotary holding unit 30 such that the rotary holding unit gradually reduces the rotation speed of the wafer W as the center of the liquid contact surface 43 approaches the outer circumference Wb.

For example, the controller 100 includes a pre-wet controller 111, a scan-in controller 112, a scan-out controller 113, a deceleration controller 114, and a cleaning/drying controller 115, as functional configurations (hereinafter, referred to as "functional modules").

The pre-wet controller 111 executes pre-wet control. The pre-wet control includes controlling the rotary holding unit 30 to rotate the holding mechanism 31 having a wafer W held thereon by the rotary mechanism 32, and controlling the rinsing liquid supply unit to supply a rinsing liquid to the surface Wa of the wafer W while the rotary holding unit 30 is rotating the wafer W.

The scan-in controller 112 executes the above-mentioned scan-in control. The scan-in control includes controlling the rotary holding unit 30 to rotate the holding mechanism 31 having the wafer W held thereon by the rotary mechanism 32, and controlling the developer supply unit 40 such that while the rotary holding unit 30 is rotating the wafer W, the developer supply unit 40 moves the nozzle 41 from an outer circumference Wb side of the wafer W to a rotation center RC side of the wafer while ejecting the developer from the ejection port 42 and bringing the liquid contact surface 43 into contact with the developer on the surface Wa of the wafer W. The scan-in controller 112 may control the developer supply unit 40 to stop the ejection of the developer from the ejection port 42 before the center of the liquid contact surface 43 reaches the rotation center RC of the wafer W.

The scan-out controller 113 executes the above-described scan-out control. The scan-out control includes controlling the rotary holding unit 30 to rotate the holding mechanism 31 having the wafer W held thereon by the rotary mechanism 32, and controlling the developer supply unit 40 such that while the rotary holding unit 30 is rotating the wafer W, the developer supply unit 40 moves the nozzle 41 from the rotation center RC side to the outer circumference Wb side of the wafer W while ejecting the developer from the ejection port 42 and bringing the liquid contact surface 43 into contact with the developer on the surface Wa of the wafer W. The scan-out controller 113 may control the rotary holding unit 30 to reduce a change in the rotation speed of the wafer W during the period from the end of the scan-in control to the start of the deceleration control in comparison with the change amount of the rotation speed of the wafer W in the above-described deceleration control. For example, the scan-out controller 113 controls the rotary holding unit 30 to keep the rotation speed of the wafer W until the start of the deceleration control to be equal to the rotation speed of the wafer W at the end of the scan-in control. The scan-out controller 113 may control the developer supply unit 40 to start the ejection of the developer from the ejection port 42 while the center of the liquid contact surface 43 is on the way of moving toward the outer circumference Wb side away from the rotation center RC of the wafer W.

The deceleration controller 114 executes the above-described deceleration control during the execution of the scan-out control. The deceleration control includes controlling the rotary holding unit 30 to gradually reduce the rotation speed of the wafer W as the center of the liquid contact surface 43 approaches the outer circumference Wb of the wafer W. In addition, gradually reducing the rotation speed includes reducing the rotation speed stepwise in multiple stages. The deceleration controller 114 may control the rotary holding unit 30 to gradually reduce the deceleration of rotation of the wafer W as the center of the liquid contact surface 43 approaches the outer circumference Wb of the wafer W. For example, the deceleration controller 114 may control the rotary holding unit such that an arbitrary point in the liquid contact surface 43 (e.g., the central point of the liquid contact surface 43) moves at a constant speed with respect to the surface Wa of the wafer W (that is, the linear speed of the one point with respect to the surface is constant). The deceleration controller 114 may control the rotary holding unit 30 to continue the deceleration of the rotation speed of the wafer W for a long time in comparison with the execution time of the scan-in control.

The cleaning/drying controller 115 executes cleaning/drying control for cleaning and drying the surface Wa of the wafer W after the development processing. The cleaning/drying control includes controlling the rotary holding unit 30 to rotate the wafer W, controlling the rotary holding unit 30 to supply the rinsing liquid to the surface Wa of the wafer W while the rotary holding unit 30 is rotating the wafer W, and controlling the rotary holding unit 30 to continue the rotation of the wafer W after the supply of the rinsing liquid is completed.

Figure 6:
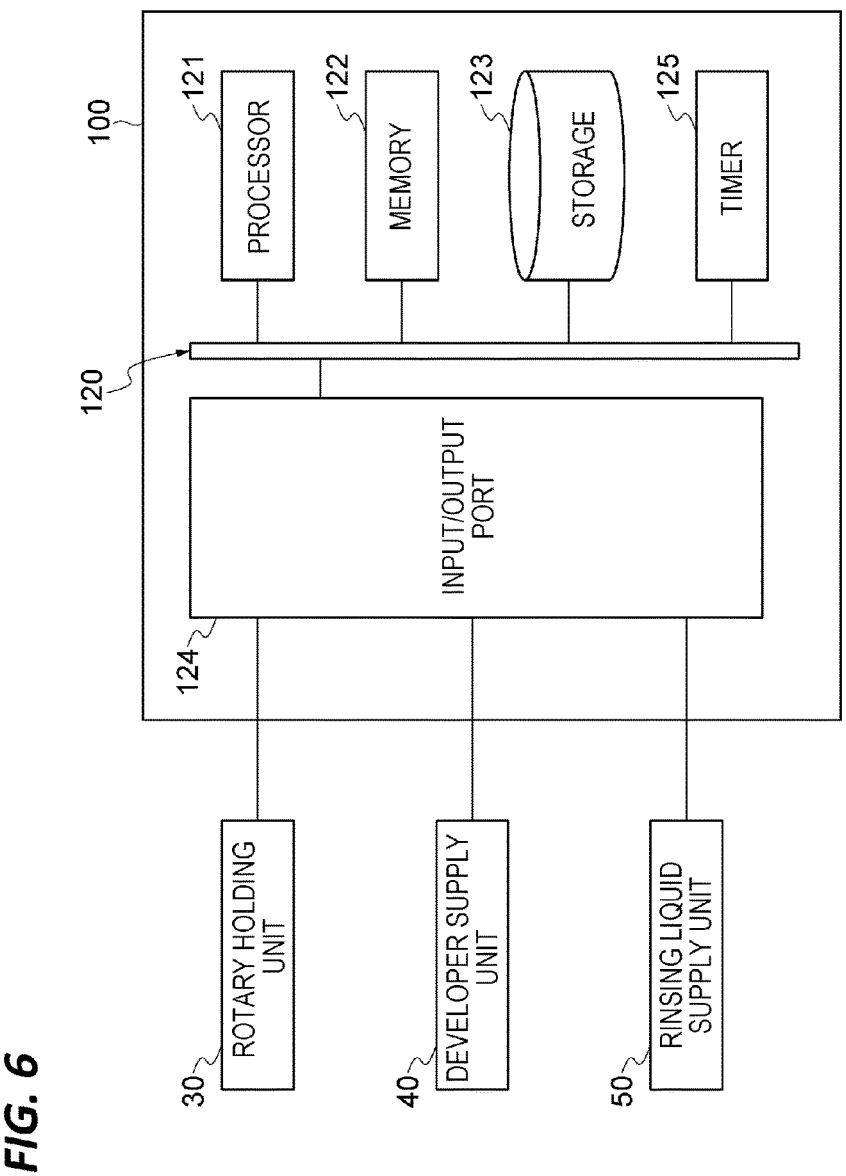
FIG. 6 is a schematic diagram exemplifying a hardware configuration of a controller.

The controller 100 is configured with one or more control computers. For example, the controller 100 includes a circuit 120 illustrated in FIG. 6. The circuit 120 includes one or more processors 121, a memory 122, a storage 123, an input/output port 124, and a timer 125. The input/output port 124 inputs and outputs electric signals with, for example, the rotary holding unit 30, the developer supply unit 40, and the rinsing liquid supply unit 50. The timer 125 counts an elapsed time by counting, for example, reference pulses of a fixed period.

The storage 123 has a computer-readable storage medium such as, for example, a hard disk. The storage medium is recorded with a program for causing the development processing apparatus 20 to execute a development processing procedure described later. The storage medium may be a removable medium such as, for example, nonvolatile semiconductor memory, a magnetic disk, or an optical disk. The memory 122 is temporarily recorded with a program loaded from the storage medium of the storage 123 and a result of calculation performed by the processor 121. The processor 121 constitutes each of the above-described functional modules by executing the program in cooperation with the memory 122.

The hardware configuration of the controller 100 is not necessarily limited to constituting each functional module by a program. For example, each functional module of the controller 100 may be constituted by a dedicated logic circuit or an Application Specific Integrated Circuit (ASIC) in which the dedicated logic circuit is integrated.

[Development Processing Procedure]

Subsequently, as an example of the development processing method, a development processing procedure executed by the development processing apparatus 20 will be described. This development processing procedure includes: holding and rotating a wafer W; causing the nozzle 41 to eject the developer from the ejection port 42 and moving the nozzle 41 from the outer circumference Wb side to the rotation center RC while bringing the liquid contact surface 43 into contact with the developer on the surface Wa of the rotating wafer W; after the nozzle 41 is moved from the outer circumference Wb side to the rotation center RC side, causing the nozzle 41 to eject the developer from the ejection port 42 and moving the nozzle 41 from the rotation center side RC to the outer circumference Wb side while bringing the liquid contact surface 43 into contact with the developer on the surface Wa of the rotating wafer W; and reducing the rotation speed of the wafer W as the center of the liquid contact surface 43 approaches the outer circumference Wb while the nozzle 41 is moving from the rotation center RC side to the outer circumference Wb side while ejecting the developer from the ejection port 42.

Figure 7:
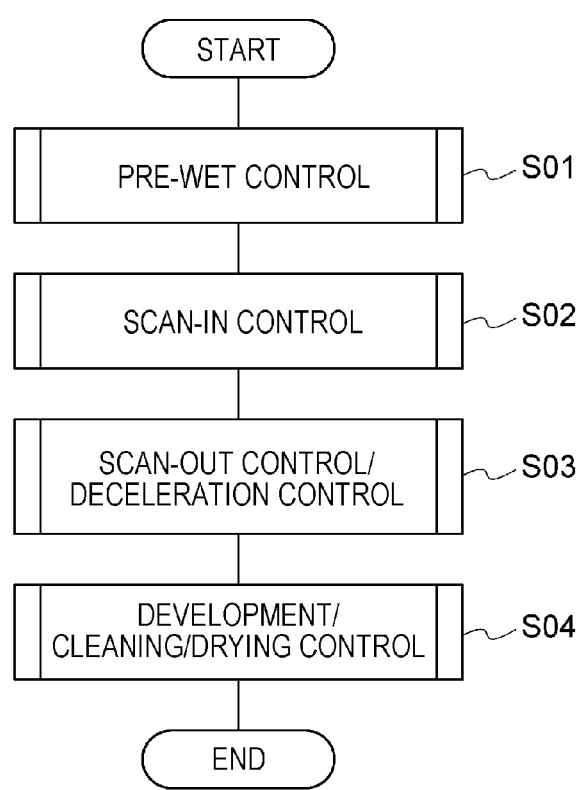
FIG. 7 is a flowchart of a development processing procedure.

For example, this development processing procedure includes steps S01, S02, S03 and S04 illustrated in FIG. 7. In step S01, the controller 100 executes the pre-wet control described above. In step S02, the controller 100 executes the above-described scan-in control. In step S03, the controller 100 executes the above-described scan-out control and deceleration control. In step S04, the controller 100 executes the cleaning/drying control described above. Hereinafter, each step will be exemplified in detail.

(Pre-Wet Control)

Figure 8:
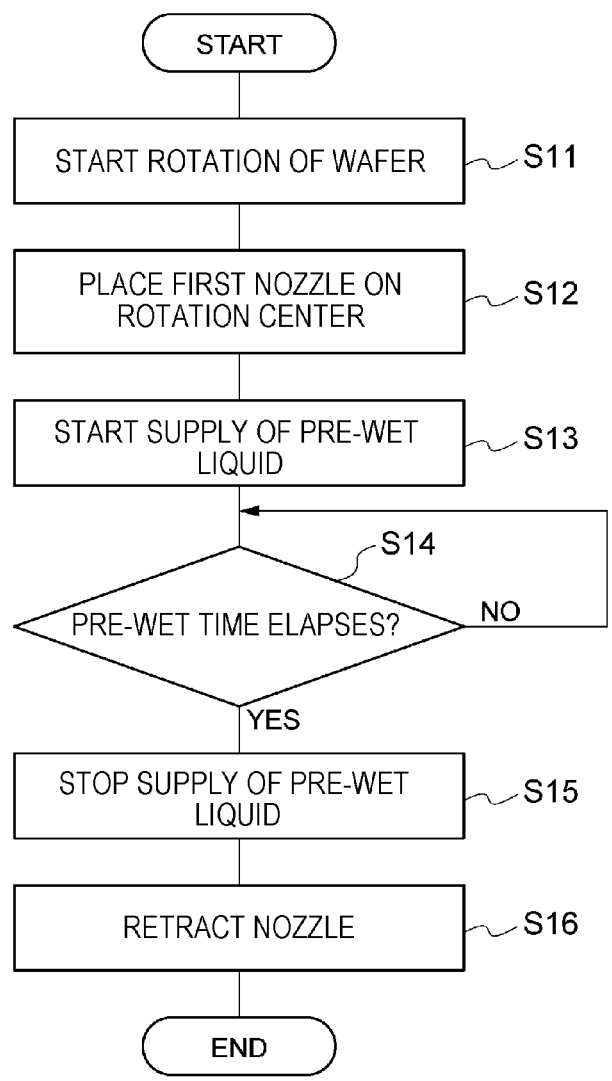
FIG. 8 is a flowchart of a pre-wet control procedure.

FIG. 8 is a flowchart illustrating the contents of step S01. As illustrated in FIG. 8, the controller 100 first executes step S11. In step S11, the pre-wet controller 111 controls the rotary holding unit 30 to start the rotation of a wafer W. For example, in a state in which the holding mechanism 31 holds the wafer W thereon, the pre-wet controller 111 controls the rotary holding unit 30 to start the rotation of the holding mechanism 31 performed by the rotary mechanism 32. Thereafter, the pre-wet controller 111 controls the rotary holding unit 30 to continue the rotation of the wafer W at a preset rotation speed oil. The rotation speed oil is, for example, 1000 to 2000 rpm, may be 1200 to 1800 rpm, or may be 1400 to 1600 rpm.

Figure 9:
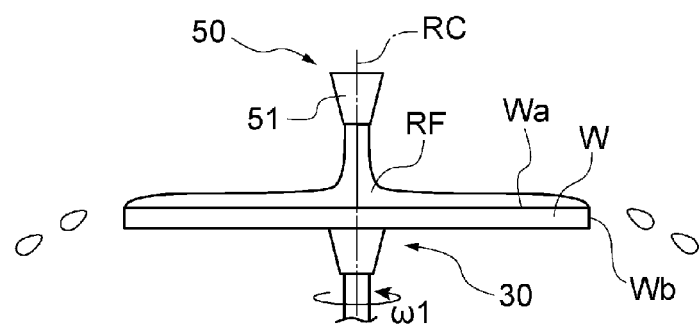
FIG. 9 is a schematic view illustrating a state of a wafer during execution of pre-wet control.

Next, the controller 100 sequentially executes steps S12, S13, and S14. In step S12, the pre-wet controller 111 controls the rinsing liquid supply unit 50 to move the nozzle 51 by the nozzle transport mechanism 56 such that the nozzle 51 is disposed at the first position for supplying the rinsing liquid. The first position is set such that, for example, the center of the nozzle 51 is located at the rotation center RC of the wafer W. In step S13, the pre-wet controller 111 controls the rinsing liquid supply unit 50 to start the supply of the rinsing liquid RF (see, e.g., FIG. 9). For example, the pre-wet controller 111 controls the rinsing liquid supply unit 50 to open the valve 55 so as to start the supply of the rinsing liquid RF from the tank 52 to the nozzle 51, and to start the ejection of the rinsing liquid RF from the nozzle 51 to the surface Wa. In step S14, the pre-wet controller 111 stands by the lapse of the preset pre-wet time. The pre-wet time is set such that the rinsing liquid spreads over the entire surface Wa of the wafer W.

Next, the controller 100 sequentially executes steps S15 and S14. In step S15, the pre-wet controller 111 controls the rinsing liquid supply unit 50 to stop the supply of the rinsing liquid. For example, the pre-wet controller 111 controls the rinsing liquid supply unit 50 to close the valve 55 and to stop the supply of the rinsing liquid from the tank 52 to the nozzle 51. In step S16, the pre-wet controller 111 controls the rinsing liquid supply unit 50 to move the nozzle 51 by the nozzle transport mechanism 56 so as to be retracted from above the wafer W. Then, the pre-wet control is completed, and a liquid film of the rinsing liquid RF is formed on the surface Wa of the wafer W.

(Scan-in Control)

Figure 10:
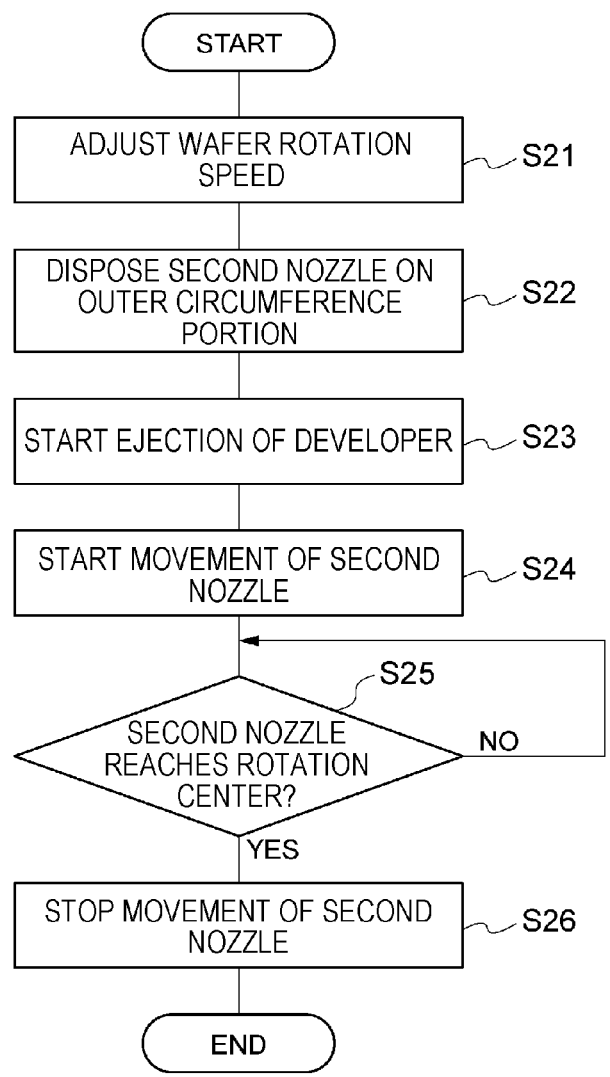
FIG. 10 is a flowchart of a scan-in control procedure.

FIG. 10 is a flowchart exemplifying the contents of step S02. As illustrated in FIG. 10, the controller 100 first executes step S21. In step S11, the scan-in controller 112 controls the rotary holding unit 30 to adjust the rotation speed of the wafer W to a preset rotation speed ω2. The rotation speed w2 is set to a value lower than the rotation speed oil. The rotation speed w2 is, for example, 400 to 1200 rpm, and may be 600 to 1000 rpm or 700 to 900 rpm.

Figure 11A:
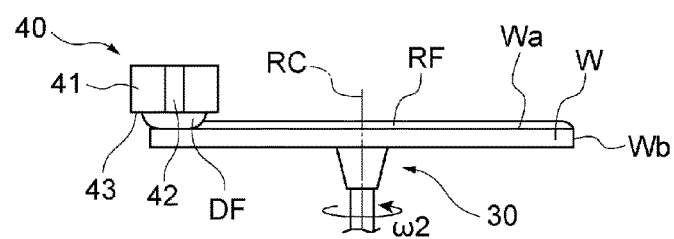
FIGS. 11A to 11C are schematic views each illustrating a state of a wafer during execution of a scan-in control.

Next, the controller 100 sequentially executes steps S22 and S23. In step S22, the scan-in controller 112 controls the developer supply unit 40 to move the nozzle 41 by the nozzle transport mechanism 48 so as to dispose the nozzle 41 at a second position for starting the scan-in. The second position is set such that the center of the liquid contact surface 43 is located on the outer circumferential portion (a portion near the outer circumference Wb) of the surface Wa. In step S23, the scan-in controller 112 controls the developer supply unit 40 to start the supply of the developer DF (see, e.g., FIG. 11A). For example, the scan-in controller 112 controls the developer supply unit to open the valve 47 so as to start the supply of the developer DF from the tank 44 to the nozzle 41, and to start the ejection of the developer DF from the ejection port 42.

Figure 11B:
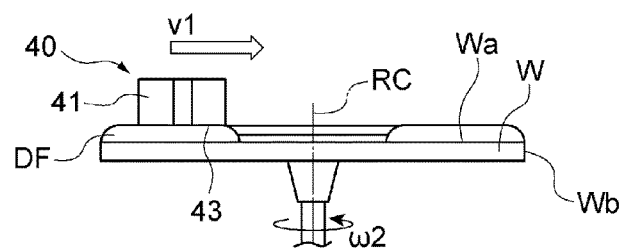
Figure 11C:
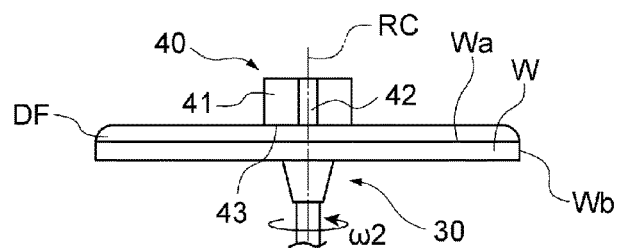

Next, the controller 100 sequentially executes steps S24, S25, and S26. In step S24, the scan-in controller 112 controls the developer supply unit 40 to start the movement of the nozzle 41 to the rotation center RC side by the nozzle transport mechanism 48. Thereafter, the scan-in controller 112 controls the developer supply unit 40 to continue the movement of the nozzle 41 at a preset moving speed v1 (see, e.g., FIG. 11B). The moving speed v1 is, for example, 15 to 100 mm/s, and may be 20 to 70 mm/s. In step S25, the scan-in controller 112 stands by the arrival of the nozzle 41 at the third position for completing the scan-in. The third position is set such that an arbitrary point in the liquid contact surface 43 (e.g., the central point of the liquid contact surface 43) is located on the rotation center RC. In step S26, the scan-in controller 112 controls the developer supply unit 40 to stop the movement of the nozzle 41 performed by the nozzle transport mechanism 48. Then, the scan-in control is completed, and the developer DF is applied to the surface Wa (see, e.g., FIG. 11C). In addition, the scan-in controller 112 may control the developer supply unit 40 to stop the ejection of the developer from the ejection port 42 before the nozzle 41 arrives at the third position.

[Scan-Out Control and Deceleration Control]

Figure 12:
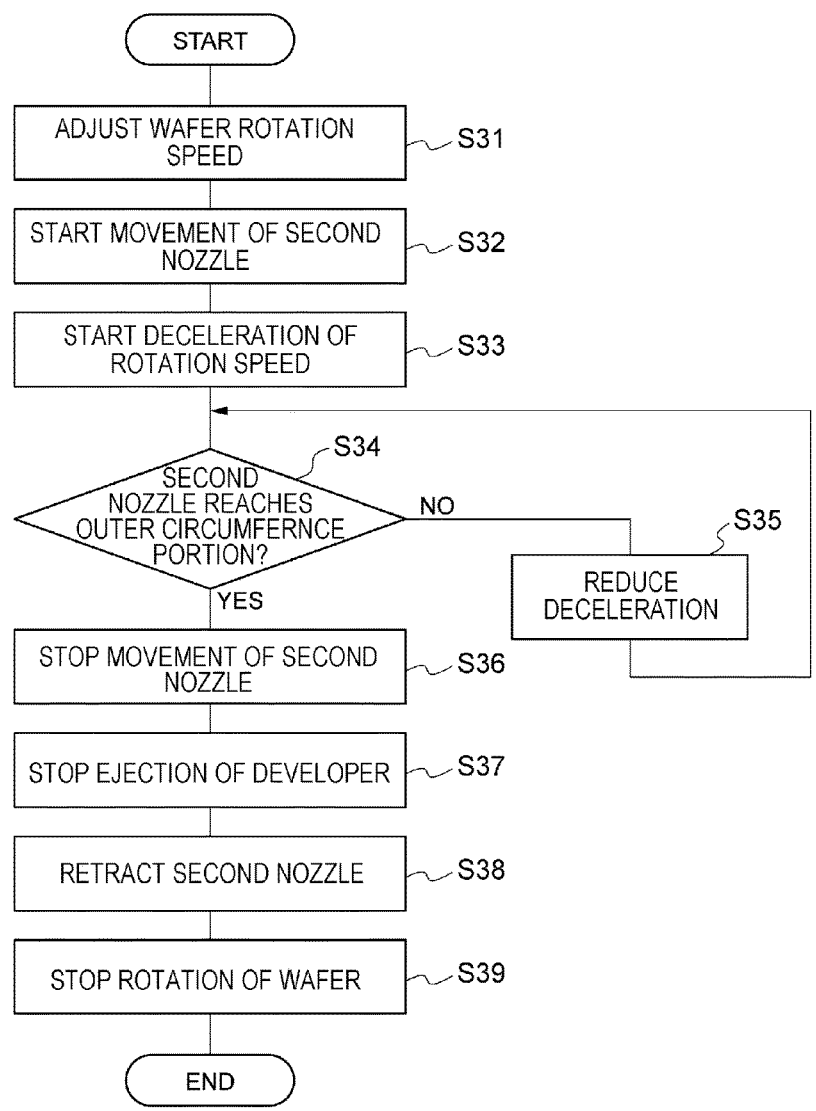
FIG. 12 is a flowchart of a scan-out control and deceleration control procedure.
Figure 13A:
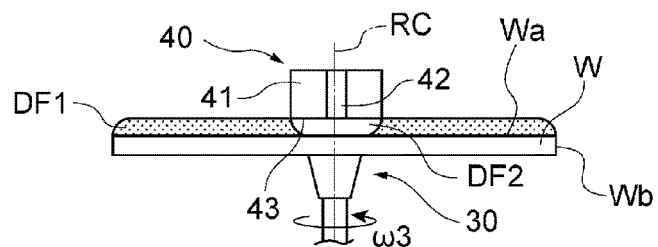
FIGS. 13A to 13D are schematic views each illustrating a state of a wafer during execution of a scan-out control.

FIG. 12 is a flowchart exemplifying the contents of step S03. As illustrated in FIG. 12, the controller 100 first executes step S31. In step S31, the scan-out controller 113 controls the rotary holding unit 30 to adjust the rotation speed of the wafer W to a preset rotation speed w3 (see, e.g., FIG. 13A). The rotation speed w3 is set such that the difference from the rotation speed w2 is small in comparison with the change amount of the rotation speed of the wafer W in the deceleration control thereafter. For example, the rotation speed w3 may be the same as the rotation speed ω2.

Figure 13B:
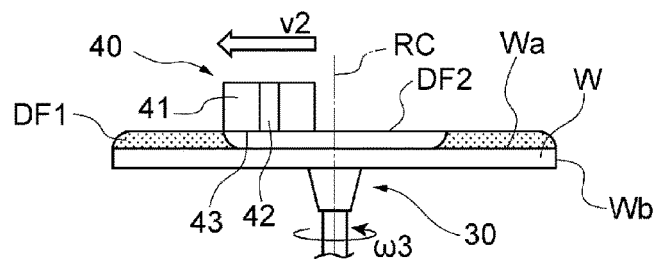
Figure 13C:
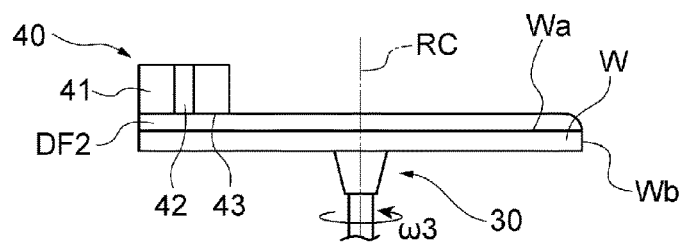

Next, the controller 100 sequentially executes steps S32 and S33. In step S 32, the scan-out controller 113 controls the developer supply unit 40 to start the movement of the nozzle 41 to the outer circumference Wb side by the nozzle transport mechanism 48. Thereafter, the scan-out controller 113 controls the developer supply unit 40 to continue the movement of the nozzle 41 at a preset moving speed v2 (see, e.g., FIG. 13B). As a result, a new developer DF2 is applied and spread while pushing the developer DF1 applied in the scan-in control to the outer circumference side (see, e.g., FIGS. 13B and 13C). The moving speed v2 is set to a value lower than the moving speed v1. As a result, the execution time of the scan-out control and the deceleration control becomes longer than the execution time of the scan-in control. The moving speed v2 may be set such that that the execution time of the scan-out control and the deceleration control is 2 to 10 times the execution time of the scan-in control. The moving speed v2 is, for example, 5 to 15 mm/s. In step S33, the deceleration controller 114 controls the rotary holding unit 30 to start the deceleration of the rotation speed of the wafer W.

Next, the controller 100 executes step S34. In step S34, the scan-out controller 113 determines whether or not the nozzle 41 has arrived at a fourth position for completing the scan-out. The fourth position is set such that that the center of the liquid contact surface 43 is located on the outer circumferential portion of the surface Wa, similarly to the second position, for example. When it is determined in step S34 that the nozzle 41 has not reached the fourth position, the controller 100 executes step S35. In step S35, the deceleration controller 114 controls the rotary holding unit 30 to decrease the deceleration of rotation of the wafer W by a predetermined pitch. Thereafter, the controller 100 returns the processing to step S34. Thereafter, until the nozzle 41 reaches the fourth position, gradually reducing the rotation speed of the wafer W while gradually reducing the deceleration is repeated. The decreasing pitch of the deceleration in step S35 is set such that, for example, the linear speed of an arbitrary point in the liquid contact surface (e.g., the central point of the liquid contact surface 43) with respect to the surface Wa becomes substantially constant.

Figure 13D:
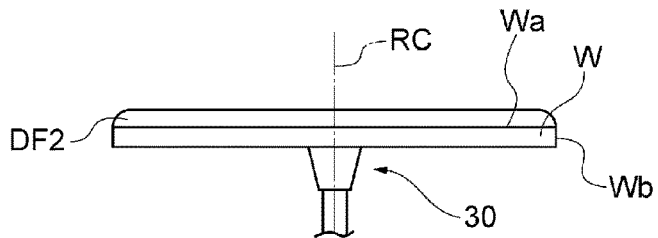

When it is determined in step S34 that the nozzle 41 has reached the fourth position, the controller 100 sequentially executes steps S36, S37, S38, and S39. In step S36, the scan-out controller 113 controls the developer supply unit 40 to stop the movement of the nozzle 41 performed by the nozzle transport mechanism 48 (see, e.g., FIG. 13C). In step S37, the scan-out controller 113 controls the developer supply unit 40 to stop the supply of the developer. For example, the scan-out controller 113 controls the developer supply unit 40 to close the valve 47 and to stop the supply of the developer from the tank 44 to the nozzle 41. In step S38, the scan-out controller 113 controls the developer liquid supply unit 40 to move the nozzle 41 by the nozzle transport mechanism 48 so as to be retracted from above the wafer W. In step S39, the scan-out controller 113 controls the rotary holding unit 30 to stop the rotation of the wafer W. Then, the scan-out control is completed, and the paddle of the developer DF 2 is formed on the surface Wa (see, e.g., FIG. 13D). In addition, when the ejection of the developer from the ejection port 42 is stopped at the completion of the scan-in control, the scan-out controller 113 may control the developer supply unit 40 to start the ejection of the developer from the ejection port 42 developer on the way of moving toward the fourth position away from the third position.

(Cleaning/Drying Control)

Figure 14:
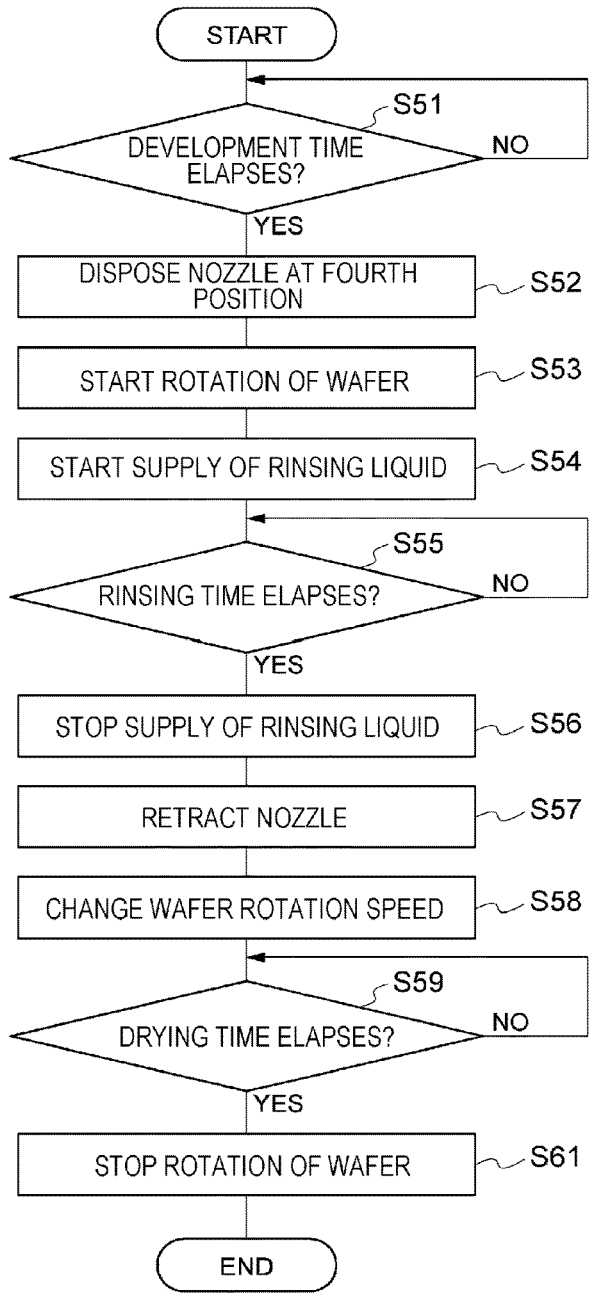
FIG. 14 is a flowchart of a cleaning/drying control procedure.

FIG. 14 is a flowchart exemplifying the contents of step S04. As illustrated in FIG. 14, the controller 100 first executes step SM. In step SM, the cleaning/drying controller 115 stands by the lapse of the development time. The development time is preset so as to optimize the degree of progress of the development processing.

Figure 15A:
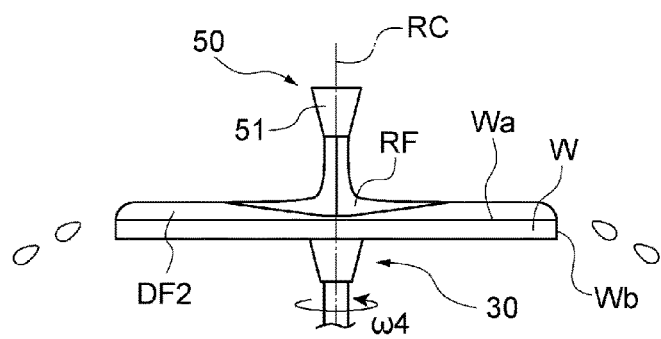
FIGS. 15A to 15C are schematic views each illustrating a state of a wafer during execution of a cleaning/drying control.
Figure 15B:
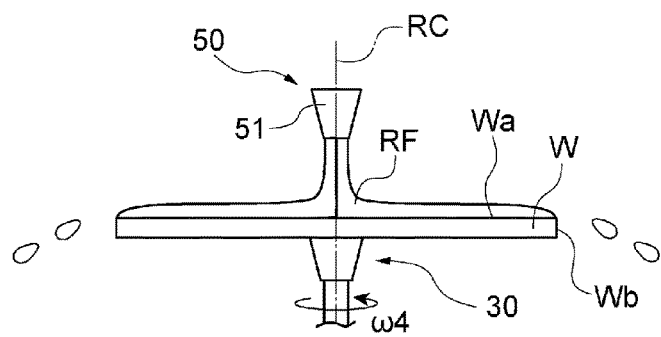

Next, the controller 100 sequentially executes steps S52, S53, S54, S55, S56, and S57. In step S52, the cleaning/drying controller 115 controls the rinsing liquid supply unit 50 to move the nozzle 51 by the nozzle transport mechanism 56 such that the nozzle 51 is disposed at a fifth position for cleaning. The fifth position is set such that, for example, the center of the nozzle 51 is located at the rotation center RC of the wafer W, similarly to the first position. In step S53, the cleaning/drying controller 115 controls the rotary holding unit 30 to start the rotation of the wafer W. Thereafter, the cleaning/drying controller 115 controls the rotary holding unit 30 to continue the rotation of the wafer W at a preset rotation speed w4. The rotation speed w4 is, for example, 500 to 2000 rpm, and may be 1000 to 1500 rpm. In step S54, the cleaning/drying controller 115 controls the rinsing liquid supply unit 50 to start the supply of the rinsing liquid RF (see, e.g., FIG. 15A). In step S55, the cleaning/drying controller 115 stands by the lapse of the rinsing time. The rinsing time is set such that the developer DF2 and dissolved matter occurring by the development processing can be sufficiently rinsed off (see, e.g., FIG. 15B). In step S56, the cleaning/drying controller 115 controls the rinsing liquid supply unit 50 to stop the supply of the rinsing liquid RF. In step S57, the cleaning/drying controller 115 controls the rinsing liquid supply unit 50 to retract the nozzle 51 from above the wafer W.

Figure 15C:
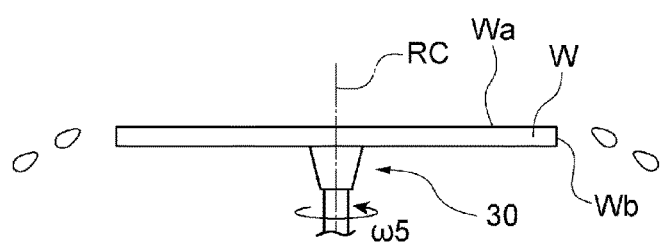

Next, the controller 100 sequentially executes steps S58, S59, and S61. In step S11, the cleaning/drying controller 115 controls the rotary holding unit 30 to change the rotation speed of the wafer W from the rotation speed ω4 to a rotation speed ω5. The rotation speed ω5 is set to a value larger than the rotation speed ω4. The rotation speed ω5 is, for example, 1500 to 4500 rpm, and may be 2000 to 4000 rpm. In step S59, the cleaning/drying controller 115 stands by the lapse of the drying time. The drying time is set such that the residual liquid on the surface Wa can be sufficiently removed (see, e.g. FIG. 15C). In step S61, the cleaning/drying controller 115 controls the rotary holding unit 30 to stop the rotation of the wafer W. Then, the cleaning/drying control is completed.

[Effect of Present Exemplary Embodiment]

As described above, the development processing apparatus 20 includes a rotary holding unit 30 configured to hold and rotate a wafer W, a developer supply unit 40 including a nozzle 41 having a liquid contact surface 43 facing the surface Wa of the wafer W held on the rotary holding unit 30 and an ejection port 42 opening to the liquid contact surface 43, and a controller 100. The controller is configured to: execute a scan-in control of controlling the developer supply unit 40 such that while the rotary holding unit 30 is rotating the wafer W, the developer supply unit 40 causes the developer to be ejected from the ejection port 42 and moves the nozzle 41 from an outer circumference Wb side of the wafer W to a rotation center RC side of the wafer while bringing the liquid contact surface 43 into contact with the developer on the surface Wa of the wafer W; execute, after executing the scan-in control, a scan-out control of controlling the developer supply unit 40 such that while the rotary holding unit 30 is rotating the wafer W, the developer supply unit 40 causes the developer to be ejected from the ejection port 42 and moves the nozzle 41 from the rotation center RC side to the outer circumference Wb side of the wafer W while bringing the liquid contact surface 43 into contact with the developer on the surface Wa of the wafer W; and execute, during the execution of the scan-out control, a deceleration control of controlling the rotary holding unit 30 such that the rotary holding unit gradually reduces the rotation speed of the wafer W as the center of the liquid contact surface 43 approaches the outer circumference Wb of the wafer.

According to the development processing apparatus 20, the developer is applied twice to the surface Wa of the wafer W by executing the scan-in control and the scan-out control. Since the contact angle of the developer with respect to the surface Wa of the wafer W is reduced by the first application, the developer is smoothly applied and spread in the second application.

In the first application, since the nozzle 41 moves from the outer circumference Wb side to the rotation center RC side of the wafer W, the developer is applied first from the outer circumference Wb side of the wafer W. On the other hand, in the second application, since the nozzle 41 moves from the rotation center RC side to the outer circumference Wb side of the wafer W, the developer is applied first from the rotation center RC side of the wafer W. Therefore, a difference in the degree of progress of the development processing, which may be caused due to a difference in application timing of the developer, hardly occurs due to the combination of the first application and the second application. Furthermore, in the second application, the nozzle 41 moves from the rotation center RC side to the outer circumference Wb side of the wafer W, whereby a new developer is applied and spread while pushing the old developer outward.

During the execution of the scan-out control, deceleration control is executed to gradually reduce the rotation speed of the wafer W as the center of the liquid contact surface 43 approaches the outer circumference Wb of the wafer W. Due to the reduction in the rotation speed, excessive sputtering of the developer is suppressed, and an appropriate liquid film is formed on the surface Wa of the wafer W. Furthermore, since the rotation speed of the wafer W is gradually reduced, the pullback (a phenomenon in which the developer spreading to the outer circumference Wb side returns to the rotation center RC side) caused by sudden deceleration is suppressed, the developer is applied and spread more smoothly.

From the above, it is possible to form a highly uniform liquid film of a developer. Therefore, the development processing apparatus 20 is effective for suppressing the degree of progress of the development processing from varying depending on a position on the wafer W.

In the deceleration control, the controller 100 may control the rotary holding unit 30 to gradually reduce the deceleration of rotation of the wafer W as the center of the liquid contact surface 43 approaches the outer circumference Wb of the wafer W. In this case, it is possible to apply and spread the processing liquid more smoothly by appropriately adjusting a centrifugal force acting on the processing liquid ejected from the nozzle 41.

In the deceleration control, the controller 100 may control the rotary holding unit 30 such that an arbitrary point in the liquid contact surface 43 moves with respect to the surface Wa of the wafer W at a constant speed. In this case, it is possible to apply and spread the developer more smoothly by more appropriately adjusting the centrifugal force acting on the processing liquid ejected from the nozzle 41.

In the scan-out control, the controller 100 may control the rotary holding unit 30 to reduce a change in the rotation speed of the wafer W during the period from the end of the scan-in control to the start of the deceleration control in comparison with the change amount of the rotation speed of the wafer W in the above-described deceleration control. In this case, by setting the rotation speed of the wafer W at the start of the deceleration control to a level close to the rotation speed of the wafer W at the end of the scan-in control, it is possible to apply and spread the developer more smoothly.

In the deceleration control, the controller 100 may control the rotary holding unit 30 to continue the deceleration of the rotation speed of the wafer W for a long time in comparison with the execution time of the scan-in control. In this case, by decelerating the rotation speed of the wafer W more gently, it is possible to apply and spread the developer more smoothly.

In the scan-out control, the controller 100 may control the developer supply unit 40 to start the ejection of the developer from the ejection port 42 while the center of the liquid contact surface 43 is on the way of moving toward the outer circumference Wb side away from the rotation center RC of the wafer W. In this case, it is possible to suppress the progress of the development processing at the rotation center RC of the wafer W.

In the scan-in control, the controller 100 may control the developer supply unit 40 to stop the ejection of the developer from the ejection port 42 before the center of the liquid contact surface 43 reaches the rotation center RC of the wafer W. In this case, it is possible to more securely suppress the progress of the development processing at the rotation center RC of the wafer W.

The development processing apparatus 20 may further include a rinsing liquid supply unit 50 configured to supply a rinsing liquid different from the developer to the surface Wa of the wafer W held on the rotary holding unit 30, and the controller 100 may configured to additionally execute pre-wet control of controlling the rinsing liquid supply unit 50 to supply the rinsing liquid to the surface Wa of the wafer W before the scan-in control is executed and while the rotary holding unit 30 rotates the wafer W. In this case, in the scan-in control, it is possible to apply and spread the developer more smoothly.

Although the exemplary embodiments have been described above, the present disclosure is not necessarily limited to the exemplary embodiments described above, and various modifications are possible without departing from the gist of the present disclosure. The processing target substrate is not limited to a semiconductor wafer, and may be, for example, a glass substrate, a mask substrate, a flat panel display (FPD), or the like.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A development processing apparatus comprising:
a rotary holding unit configured to hold and rotate a wafer;
a first supply unit including a nozzle having a liquid contact surface facing a surface of the wafer held on the rotary holding unit and an ejection port opening to the liquid contact surface; and
a controller,
wherein the controller is configured to:
execute a scan-in control of controlling the first supply unit such that while the rotary holding unit is rotating the wafer, the first supply unit causes a developer to be ejected from the ejection port and move the nozzle from an outer circumference side of the wafer to a rotation center side of the wafer while bringing the liquid contact surface into contact with the developer on the surface of the wafer;
execute, after executing the scan-in control, a scan-out control of controlling the first supply unit such that while the rotary holding unit is rotating the wafer, the first supply unit causes the developer to be ejected from the ejection port and moves the nozzle from the rotation center side to the outer circumference side of the wafer while bringing the liquid contact surface into contact with the developer on the surface of the wafer; and
execute, during the execution of the scan-out control, a deceleration control of controlling the rotary holding unit such that the rotary holding unit gradually reduces a rotation speed of the wafer as a center of the liquid contact surface approaches the outer circumference of the wafer.

2. The development processing apparatus of claim 1, wherein, in the deceleration control, the controller controls the rotary holding unit to gradually reduce deceleration of the rotation of the wafer as the center of the liquid contact surface approaches the outer circumference of the wafer.

3. The development processing apparatus of claim 2, wherein, in the deceleration control, the controller controls the rotary holding unit such that an arbitrary point in the liquid contact surface moves at a constant speed with respect to the surface of the substrate.

4. The development processing apparatus of claim 1, wherein, in the scan-out control, the controller controls the rotary holding unit to reduce a change in the rotation of the substrate during a period from an end of the scan-in control to a start of the deceleration control in comparison with a change amount of the rotation speed of the substrate in the deceleration control.

5. The development processing apparatus of claim 1, wherein, in the deceleration control, the controller controls the rotary holding unit to continue the deceleration of the rotation speed of the substrate for a long time in comparison with an execution time of the scan-in control.

6. The development processing apparatus of claim 1, wherein, in the scan-out control, the controller controls the first liquid supply unit to eject the developer from the ejection port while a center of the liquid contact surface is on a way of moving toward the outer circumference side away from the rotation center of the substrate.

7. The development processing apparatus of claim 6, wherein, in the scan-out control, the controller controls the first liquid supply unit to stop the ejection of the developer from the ejection port before the center of the liquid contact surface reaches the rotation center of the substrate.

8. The development processing apparatus of claim 1, further comprising:
a second supply unit configured to supply a pre-wet liquid different from the developer to the surface of the substrate held on the rotary holding unit,
wherein the controller is configured to additionally execute pre-wet control of controlling the second supply unit to supply the pre-wet liquid to the surface of the substrate before execution of the scan-in control and while the rotary holding unit rotates the substrate.

9. A development processing method comprising:
holding and rotating a wafer;
causing a developer to be ejected from an ejection port of a nozzle having a liquid contact surface and the ejection port which opens to the liquid contact surface, and moving the nozzle from an outer circumference side to a rotation center side of the nozzle while bringing the liquid contact surface into contact with the developer on the surface of the rotating substrate;
after moving the nozzle to from the outer circumference side to the rotation center side of the substrate, causing the developer to be ejected from the ejection port and moving the nozzle from the rotation center side to the outer circumference side of the substrate while bringing the nozzle into contact with the developer on the surface of the rotating substrate; and
reducing a rotation speed of the substrate as a center of the liquid contact surface approaches the outer circumference of the substrate while the nozzle moves from the rotation center side to the outer circumference side of the substrate while ejecting the developer from the ejection port.

10. A non-transitory computer-readable storage medium storing a program that causes an apparatus to execute the development processing method of claim 9.

* * * * *